(12) United States Patent
Watanabe et al.

(10) Patent No.: US 7,825,696 B2
(45) Date of Patent: Nov. 2, 2010

(54) EVEN-NUMBER-STAGE PULSE DELAY DEVICE

(75) Inventors: Takamoto Watanabe, Nagoya (JP); Shigenori Yamauchi, Nisshin (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 12/653,664

(22) Filed: Dec. 16, 2009

(65) Prior Publication Data

US 2010/0156468 A1    Jun. 24, 2010

(30) Foreign Application Priority Data

Dec. 22, 2008   (JP) .............. 2008-325661

(51) Int. Cl.
*H03K 19/00* (2006.01)
(52) U.S. Cl. .............. 326/93; 326/94; 326/96
(58) Field of Classification Search ........ None
See application file for complete search history.

(56) References Cited

U.S. PATENT DOCUMENTS 5,416,444 A    5/1995   Yamauchi et al.
5,477,196 A    12/1995  Yamauchi et al.
5,525,939 A *  6/1996   Yamauchi et al. ......... 331/57
7,710,208 B2 * 5/2010   Goff ..................... 331/57

FOREIGN PATENT DOCUMENTS

| JP | 06-216721 | 8/1994 |
| JP | 07-183800 | 7/1995 |
| JP | 07-312288 | 11/1995 |

\* cited by examiner

*Primary Examiner*—Anh Q Tran
(74) *Attorney, Agent, or Firm*—Harness, Dickey & Pierce, PLC

(57) ABSTRACT

The even-number-stage pulse delay includes a ring delay line constituted of an even number of inverter circuits connected in a ring around which main edge and a reset edge circulate together. The even-number-stage pulse delay is provided with an operation monitoring section configured to detect whether or not the main and reset edges are circulating around the ring delay line.

7 Claims, 5 Drawing Sheets

EVEN-NUMBER-STAGE PULSE DELAY DEVICE

CROSS-REFERENCE TO RELATED APPLICATION

This application is related to Japanese Patent Application No. 2008-325661 filed on Dec. 22, 2008, the contents of which are hereby incorporated by reference.

BACKGROUND OF THE INVENTION

1. Field of the Invention

The present invention relates to an even-number-stage pulse delay device including a ring delay line constituted of an even number of inverter circuits connected in a ring, and configured to cause a pulse edge to circulate around the ring delay line.

2. Description of Related Art

There is known a pulse phase difference encoding circuit provided with an even-number-stage pulse delay device for detecting a phase difference between two pulses and encoding the phase difference into a binary digital signal. For example, refer to Japanese Patent Application Laid-open No. 6-216721, or 7-183800.

This even-number-stage pulse delay device includes a ring delay line constituted of an even number of inverter circuits connected in a ring, each of the inverter circuits inverting an input signal passing therethrough. The ring delay line is configured such that one of the inverter circuits serves as a first starting inverter circuit which starts its inverting operation in response to a first control signal, and one of the inverter circuits excluding the first starting inverter circuit and the inverter circuit following this first starting inverter circuit serves as a second starting inverter circuit which starts its inverting operate in response to a second control signal.

This even-number-stage pulse delay device further includes a second-control-signal inputting circuit which inputs the second control signal to the second starting inverter circuit during a period from when the first starting inverter circuit starts its inverting operation in response to the first control signal inputted thereto to when an edge (main edge) of a pulse generated for the first time by the inverting operation reaches the second starting inverter circuit, by for example, inputting the output of one of the inverter circuit disposed between the first and second starting inverter circuits to the second starting inverter circuit as the second control signal.

That is, the second-control-signal inputting circuit causes the main edge and a reset edge of a pulse inverting oppositely to the main edge to circulate within the ring delay line.

According to the above even-number-stage pulse delay device, since the main edge and the reset edge circulates around the ring delay line keeping a predetermined distance (a predetermined number of the inverter gates) therebetween, it is possible to stably obtain an oscillation signal having a period determined by the number of the inverter circuits constituting the ring delay line.

Further, the pulse phase difference encoding circuit including the even-number-stage pulse delay device can easily encode the number of times that the main edge (or the reset edge) has circulated around the ring delay line and the position of the main edge (or the reset if the number of the inverter circuits constituting the ring delay line is set to 2n (n being a positive integer).

However, the above even-number-stage pulse delay device has a problem in that if one of the inverter circuits malfunctions due to external noise, for example, the circulation of the edge (pulse) is stopped because the ring delay line enters a stable state in which the outputs of each adjacent inverter circuits are at opposite levels.

Meanwhile, since the even-number-stage pulse delay device can be constituted of logic gate circuits such as inverter gate circuits, NAND gate circuits, or NOR gate circuits, the even-number-stage pulse delay device has been increasingly downsized and become faster with the miniaturization progress in semiconductor circuit manufacturing technique (process technique) like other digital circuits.

However, to make the even-number-stage pulse delay device compact in size and able to operate in high speed utilizing the miniaturization progress in semiconductor circuit manufacturing technique, it is necessary to lower the power supply voltage applied to the even-number-stage pulse delay device, although the noise immunity of the even-number-stage pulse delay device is degraded. Accordingly, in this case, when a large noise signal comes from outside, or when there occurs an abnormal momentary voltage drop, the circulation of the pulse within the ring delay line easily stops.

In addition, if the structure of the even-number-stage pulse delay device is modified to have multiple different transistor thresholds with the miniaturization progress in semiconductor circuit manufacturing technique, since the design margin of the even-number-stage pulse delay device is reduced, and manufacturing variation in electrical characteristics increases, it becomes difficult for the even-number-stage pulse delay device to operate stably.

It may occur that the circulation of the pulse within the ring delay line is forcibly stopped and restarted periodically for the even-number-stage pulse delay device to operate stably. However, this involves a problem that since the forcible stop and restart are performed even when the ring delay line is operating normally, needless dysfunctional periods occur, and electric power is consumed uselessly. Furthermore, since the even-number-stage pulse delay device has to be provided with a control circuit dedicated to perform the forcible stop and restart, the manufacturing cost increases.

SUMMARY OF THE INVENTION

The present invention provides an even-number-stage pulse delay device comprising:

a ring delay line constituted of an even number of inverter circuits connected in a ring, each of the inverter circuits being configured to perform an inverting operation to invert an input signal passing therethrough, a first one of the inverter circuits serving as a first starting inverter circuit which performs the inverting operation when applied with a first control signal, a second one of the inverter circuits excluding the first starting inverter circuit and excluding one of the inverter circuits immediately following the first one of the inverter circuits serving as a second starting inverter circuit which performs the inverting operation when applied with a second control signal;

a second-control-signal inputting section configured to cause an edge of a first pulse as a main edge and an edge of a second pulse as a reset edge which inverts in an opposite direction as the main edge to circulate together around the ring delay line, the first pulse being generated by applying the first control signal to the first starting inverter circuit to cause the first starting inverter circuit to perform the inverting operation, the second pulse being generated by applying the second control signal to the second starting inverter circuit during a time period after the main edge is generated at the first starting inverter circuit and before the main edge reaches the second starting inverter circuit from the first starting inverter circuit; and an operation monitoring section configured to detect whether or not the main and reset edges are circulating around the ring delay line.

According to the present invention, there is provided an even-number-stage pulse delay device including a ring delay line constituted of an even number of inverter circuits connected in a ring, which is capable of automatically detect stoppage of pulse circulation around the ring delay line, and taking necessary corrective measures, for example, restarting the pulse circulation around the ring delay line.

Other advantages and features of the invention will become apparent from the following description including the drawings and claims.

PREFERRED EMBODIMENTS OF THE INVENTION

Figure 1:
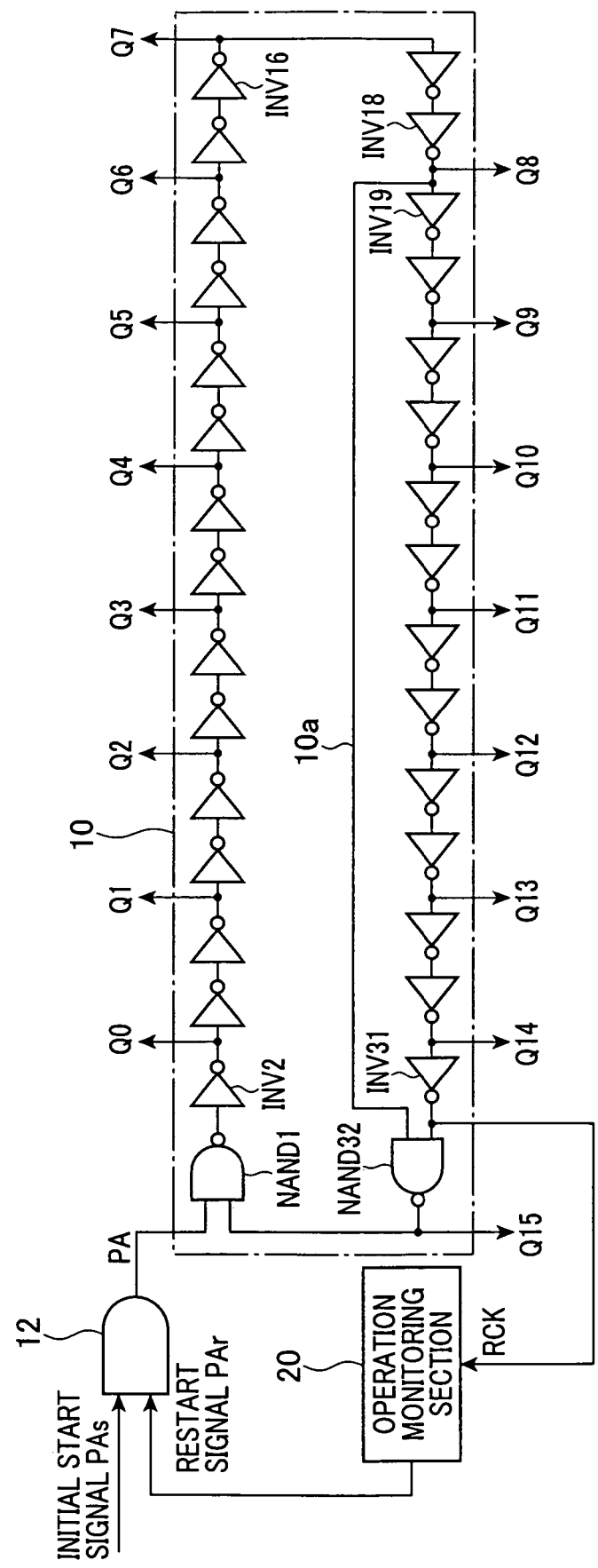
FIG. 1 is a diagram showing the overall structure of an even-number-stage pulse delay device according to an embodiment of the invention.

FIG. 1 is a diagram showing the overall structure of an even-number-stage pulse delay device according to a first embodiment of the invention.

As shown in FIG. 1, the even-number-stage pulse delay device of this embodiment includes a ring delay line 10 constituted of 32 inverter circuits connected in a ring. In more detail, the ring delay line 10 is constituted of a 2-input NAND gate circuit NAND1 (referred to as a NAND gate NAND1 hereinafter) as the first starting inverter circuit, and 30 inverter gate circuits INV2 to INV31 (referred to as inverters INV2 to INV31 hereinafter), and a 2-input NAND gate circuit NAND32 (referred to as a NAND gate NAND32 hereinafter) as the second starting inverter circuit.

Here, the number affixed to "NAND" or "INV" represents the stage number of the gate circuits from 1 to 32 in the direction of travel of a pulse, when the NAND gate as the first starting inverter circuit is assumed to be a first stage gate circuit.

One input terminal of the NAND gate NAND1 not connected to the NAND gate NAND32 (the input terminal being referred to as "starting terminal" hereinafter) is applied with a start pulse PA from outside as a first control signal. One input terminal of the NAND gate NAND32 not connected to the NAND gate NAND31 (the input terminal being referred to as "control terminal" hereinafter) is applied with the output Q8 of the inverter INV18 through a bypass path 10a bypassing the inverters INV19 to INV31 as a second control signal.

The inverters INV19 to INV31 are set such that the falling inversion response time is faster than the rising inversion response time for the even stage inverters, while on the other hand, the rising inversion response time is faster than the falling inversion response time for the odd stage inverters.

Figure 2A:
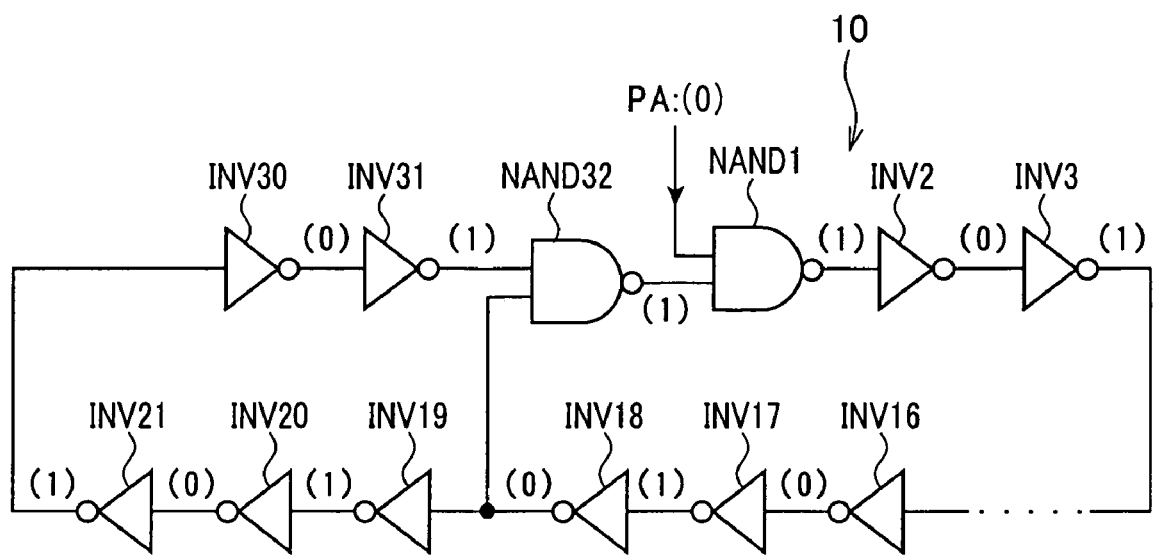
FIG. 2A is a diagram showing input and output levels of inverter circuits constituting a ring delay line included in the even-number-stage pulse delay device when the ring delay line is in the initial state.

In the ring delay line 10 having the above described structure, the outputs of the even stage inverters (Q0 to Q15) are at the low level (0) and the outputs of the odd stage inverters are at the high level (1) in its initial state where the start pulse PA is at the low level (0) in the initial state of the ring delay line 10, because the output of the NAND gate NAND1 is at the high level in this state as shown in FIG. 2A.

In this initial state, however, the output Q15 of the NAND gate NAND 32 is at the high level (1) although it is one of the even stage gate circuits, because the output Q8 of the inverter INV 18 applied to the control terminal of the NAND gate NAND 32 is at the low level (0).

Next, when the start pulse PA changes from the low level (0) to the high level (1), the output of the NAND gate NAND1 changes from the high level (1) to the low level (0), causing the outputs of the following inverters to invert in succession. As a result, the odd stage inverters change from the high level (1) to the low level (0), and the even stage inverters change from the low level (0) to the high level (1).

Here, the edge of a pulse which circulates around the ring delay line 10, falling at the output of each odd stage NAND gate and odd stage inverter and rising at the output of each even stage NAND gate and even stage inverter is called a main edge.

When the main edge reaches the inverter INV18 to cause the output Q8 of the inverter INV18 to change from the low level (0) to the high level (1), since the output of the inverter INV31 is still at the high level (1) at the time, both the two inputs applied to the NAND gate NAND32 change to the high level (1), as a result of which the NAND gate NAND32 starts inverting to cause its output Q15 to change form the high level (1) to the low level (0).

The edge of a pulse which circulates around the ring delay line 10, being inverted by the NAND gate NAND32 when the main edge is applied to the control terminal of the NAND gate NAND 32, rising at the output of each odd stage NAND gate and odd stage inverter and falling at the output of each even stage NAND gate and even stage inverter is called a reset edge. The reset edge travels through the ring delay line 10 together with the main edge generated at the NAND gate NAND1.

Thereafter, the main edge reaches the inverter INV31 while being successively inverted by the inverters following the inverter INV18, and as a result, the output of the inverter INV31 changes from the high level (1) to the low level (0). This means that the main edge enters the NAND gate NAND32. At this moment, since the input level of the control terminal of the NAND gate NAND32, and accordingly the output Q18 of the inverter INV18 are at the high level (1), the main edge is successively inverted by the NAND gate NAND32, NAND gate NAND1 and the inverters following the NAND gate NAND1 to continue to travel through the ring delay line 10.

Incidentally, the reason why the output Q8 of the inverter INV18 is still at the high level (1) at the moment when the main edge has reached the NAND gate NAND32 by way of the inverters INV19 to INV32 is that since the number of the inverters disposed between the inverter INV19 and the inverter INV31 is 13, while the number of the inverters and NAND gates disposed between the NAND gate NAND32 and the inverter INV18 is 19, the main edge reaches the NAND gate NAND32 before the reset edge reaches the inverter INV18 from the NAND gate NAND 32.

On the other hand, the reset edge generated at the NAND gate NAND32 again reaches the inverter INV18 by way of the inverters including the NAND gate NAND1, and as a result, the input level of the control terminal of the NAND gate NAND32 changes from the high level (1) to the low level (0). At this moment, since the input level applied from the inverter INV31 to the NAND gate NAND32 has already changed to the low level (0) by the main edge, the output Q15 of the NAND gate NAND32 does not change, and accordingly the reset edge travels from the inverter INV18 to the NAND gate NAND32 by way of the normal path from the inverter INV19 to the inverter INV31.

Thereafter, when the reset edge reaches the inverter INV 31, the input level applied from the inverter INV31 to the NAND gate NAND32 changes from the low level (0) to the high level (1). At substantially the same time as this change, the main edge reaches the inverter INV18, as a result of which the input level of the control terminal of the NAND gate NAND32 changes from the low level (0) to the high level (1).

The reason is that the main edge generated at the NAND gate NAND1 makes one circulation around the ring delay line 10 to reach the inverter INV18 after passing through the NAND gate NAND1 again, while on the other hand, the reset edge is generated by the inverting operation of the NAND gate NAND32 after the main edge travels from the NAND gate NAND1 to the inverter INV18, and then makes one circulation around the ring delay line 10. That is, the number of the inverter gates and the NAND gates which the main edge passes through to reach the NAND gate NAND32 and that which the reset edge passes through to reach the NAND gate NAND32 are both 50.

However, in this embodiment, the inverters INV19 to INV31 are set such that the falling inversion response time is faster than the rising inversion response time for the even stage inverters, while on the other hand, the rising inversion response time is faster than the falling inversion response time for the odd stage inverters. Accordingly, the reset pulse reaches the NAND gate NAND 32 slightly earlier than the main edge.

As a result, since the input level of the control terminal of the NAND gate NAND32 is still at the low level (0), when the output of the inverter INV31 is changed from the low level (0) to the high level (1) by the reset edge, the output Q15 of the NAND gate NAND32 changes from the high level (1) to the low level (0) only after the main edge reaches the inverter INV18 a little later, causing the input level of the control terminal of the NAND gate NAND32 to change from the low level (0) to the high level (1). That is, the reset edge disappears temporarily at this moment, and then regenerated by the main edge.

The reset edge regenerated by the main edge travels from the NAND gate NAND32 to the NAND gate NAND1, while on the other hand, the main edge travels from the inverter INV1 to the NAND gate NAND32 by way of the normal path. Accordingly, thereafter, the reset pulse is regenerated each time the main edge makes one circulation around the ring delay line 10, so that the reset pulse continues to circulate around the ring delay line 10 together with the main edge.

To stop the circulation of these edges within the ring delay line 10, the start pulse PA is changed from the high level (1) to the low level (0). To restart the circulation of these edges within the ring delay line 10, the start pulse PA is changed from the low level (0) to the high level (1).

Figure 2B:
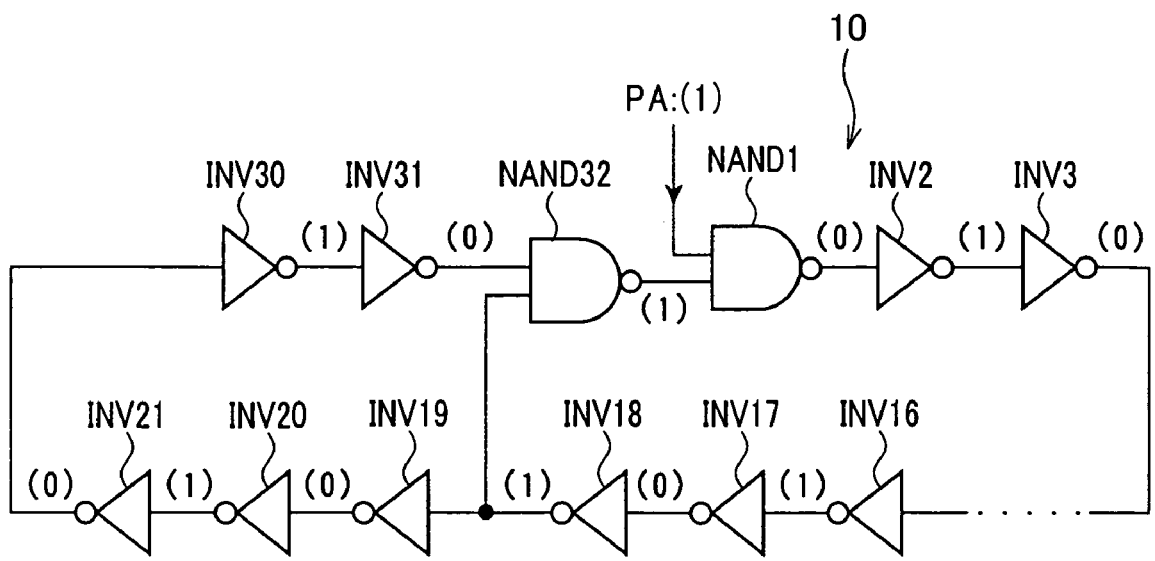
FIG. 2B is a diagram showing input and output levels of the inverter circuits constituting the ring delay line when the ring delay line is in the stopped state.

Incidentally, since the ring delay line 10 is constituted of an even number of the inverter circuits (NAND1, INV 2-31, NAND32), if one of the inverter circuits malfunctions due to external noise or drop in the power supply voltage, causing the pulse circulation (edge circulation) to stop after the start pulse PA is changed from the low level (0) to the high level (1) to start the pulse circulation, the outputs of the odd stage inverter circuits become low level (0), and the outputs of the even stage inverter circuits (Q0 to Q15) become high level (1) as shown in FIG. 2B. Since the ring delay line 10 becomes stable in this stage, the pulse circulation within the ring delay line 10 is completely stopped.

To remove this problem, the even-number-stage pulse delay device of this embodiment is provided with an operation monitoring section 20 as shown in FIG. 1. The operation monitoring section monitors the pulse circulation in the ring delay line 10, and upon detecting that the pulse circulation is stopped, changes the start pulse PA back to the low level (0) temporarily, and then changes the start pulse PA to the high level (1) again to restart the pulse circulation.

Figure 3:
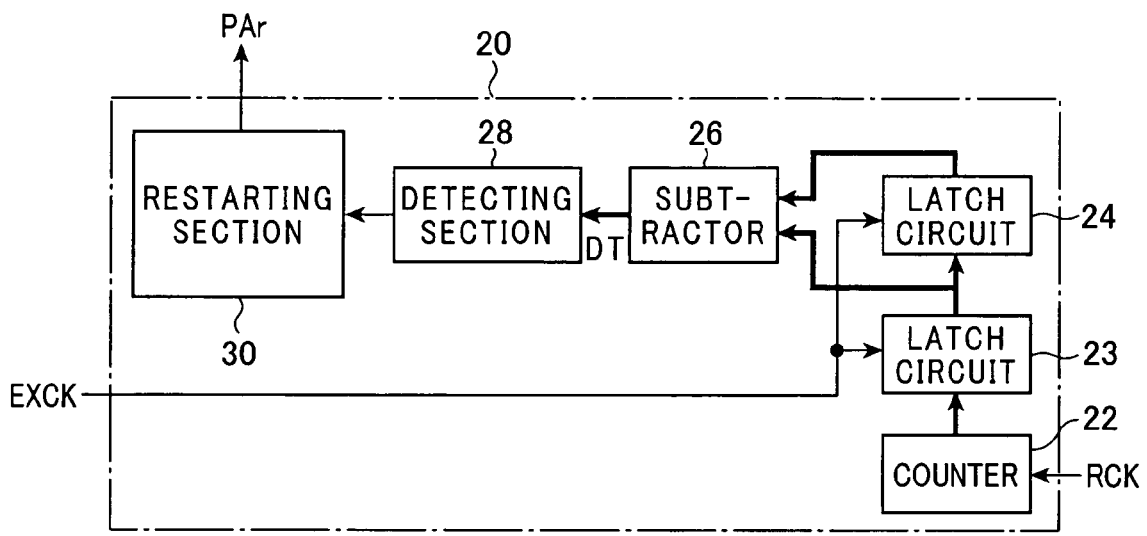
FIG. 3 is a block diagram showing the structure of an operation monitoring section included in the even-number-stage pulse delay device.

As shown in FIG. 3, the operation monitoring section 20 includes a counter 22, latch circuits 23 and 24, and a subtractor 26. The counter 22 takes in and counts the output of one of the inverters (the inverter INV31 in this embodiment) as an operation clock RCK of the ring delay line 10. The latch circuit 23 latches the count value of the counter 22 in synchronism with an external clock EXCK. The latch circuit 24 latches the output of the latch circuit 23 in synchronism with the external clock EXCK. The subtractor 26 calculates the difference DT between the outputs of the latch circuits 23 and 24 by subtracting the output of the latch circuit 24 from the output of the latch circuit 23.

The period of the external clock EXCK is set longer than the time needed for the edges (the pulses) to make one circulation around the ring delay line 10.

Accordingly, while the operation clock RCK is periodically outputted from the ring delay line 10 (that is, while the ring delay line 10 operates normally), the output DT of the subtractor 26 is larger than 1. On the other hand, when the output of the operation clock RCK from the ring delay line 10 is stopped (that is, when the ring delay line 10 stops its operation), the output DT of the subtractor 26 becomes 0.

The operation monitoring section 20 is further provided with a detecting section 28 to determine whether or not the output DT of the subtractor 26 is 0 (that is, whether or not the ring delay line 10 is not operating), and a restarting section 30 to generate a restart signal PAr in accordance with the result of the determination by the detecting section 28.

The restarting section 30 changes the restart signal PAr which is normally set to the high level (1) to the low level (0) when the detecting section 28 determines that the ring delay line 10 is not operating (DT=0) in order to set the start pulse PA inputted to the ring delay line 10 to the low level (0), and thereafter sets the restart signal PAr to the high level (1) in order to set the start pulse PA to the high level (1) so that the ring delay line 10 restarts.

Accordingly, the input path through which the start pulse PA is inputted to the ring delay line 10 is provided with an AND gate 12 which generates the start pulse PA from an initial start signal PAs received from outside and the restart signal PAr received from the restarting section 30 of the operation monitoring section 20.

Figure 4:
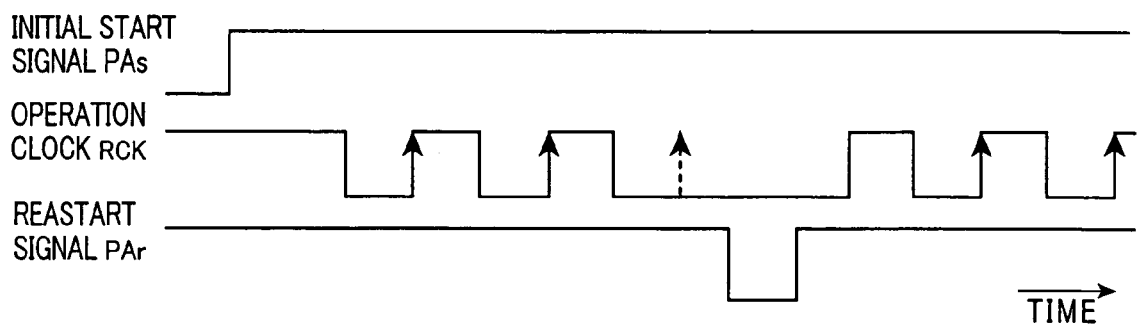
FIG. 4 is a time chart explaining an initial start signal and a restart signal used to start and restart the ring delay line.

As shown in FIG. 4, the restarting section 30 normally outputs the restart signal PAr at the high level (1) so that the initial start signal PAs can be selectively outputted from the AND gate 12. Upon detecting that the ring delay line 10 is not operating when the initial start signal PAs is at the high level (1), the restarting section 30 changes the restart signal PAr to the low level (0) temporarily to cause the AND gate 12 to output the restart signal PAr at the low level (0) for restarting the ring delay line 10.

As explained above, the even-number-stage pulse delay device of this embodiment is provided with the operation monitoring section 20 to monitor the pulse circulation within the ring delay line 10. Upon detecting that the ring delay line 10 is not operating, the operation monitoring section 20 changes the restart signal PAr to the low level (0) temporarily in order to reset the ring delay line 10 to its initial state, and thereafter, returns the restart signal PAr to the high level (1) to cause the ring delay line 10 to restart.

Hence, the even-number-stage pulse delay device of this embodiment can detect stoppage of the pulse circulation within the ring delay line 10 due to external noise or drop of the power supply voltage, and automatically restart the ring delay line 10.

Accordingly, various electronic circuits including the even-number-stage pulse delay device of this embodiment such as a pulse phase difference encoding circuit, A/D converter, or PLL circuit can automatically return to their normal state to prevent malfunction or abnormal break down.

To enable the ring delay line 10 to start by the initial start signal PAs received from outside, and to restart by the restart signal PAr received from the restarting section 30, the even-number-stage pulse delay device of this embodiment is further provided with the AND gate 12 which takes in theses signals and outputs the pulse signal PA in accordance with these signals. This makes it unnecessary to provide a starting circuit dedicated to start and restart the ring delay line 10 to thereby simplify the circuit structure of the even-number-stage pulse delay device.

The ring delay line 10 is constituted of logic gate circuits (the inverters and NAND gates), and the operation monitoring section 20 is also constituted of digital circuits. Accordingly, the even-number-stage pulse delay device of this embodiment can be formed on the same IC chip by the CMOS process including the AND gate 12.

This makes it possible to form the even-number-stage pulse delay device on the same IC chip together with other functional CMOS circuits such as a multiplier, an adder, a memory device, a CPU, an amplifier and a comparator.

In this case, if a clock signal used in other CMOS functional circuits formed on the same IC chip is used as the external clock EXCK, it becomes quite easy to detect whether the ring delay line 10 is operating or not.

It is a matter of course that various modifications can be made to the above described embodiment of the invention as described below.

In the above embodiment, the operation monitoring section 20 is configured to take in the output of one of the inverter circuits constituting the ring delay line 10, and determines that the operation of the ring delay line 10 is being stopped if this output does not change over a predetermined time period set in accordance with the period of the external clock EXCK.

However, since the outputs of all the even stage inverter circuits are at the high level (1), and the outputs of all the odd stage inverter circuits are at the low level (0) while the ring delay line 10 stops its operation, the operation monitoring section 20 may determine that the operation of the ring delay line 10 is stopped if the output of all the even or odd stage inverter circuits are fixed to the same level.

Figure 5:
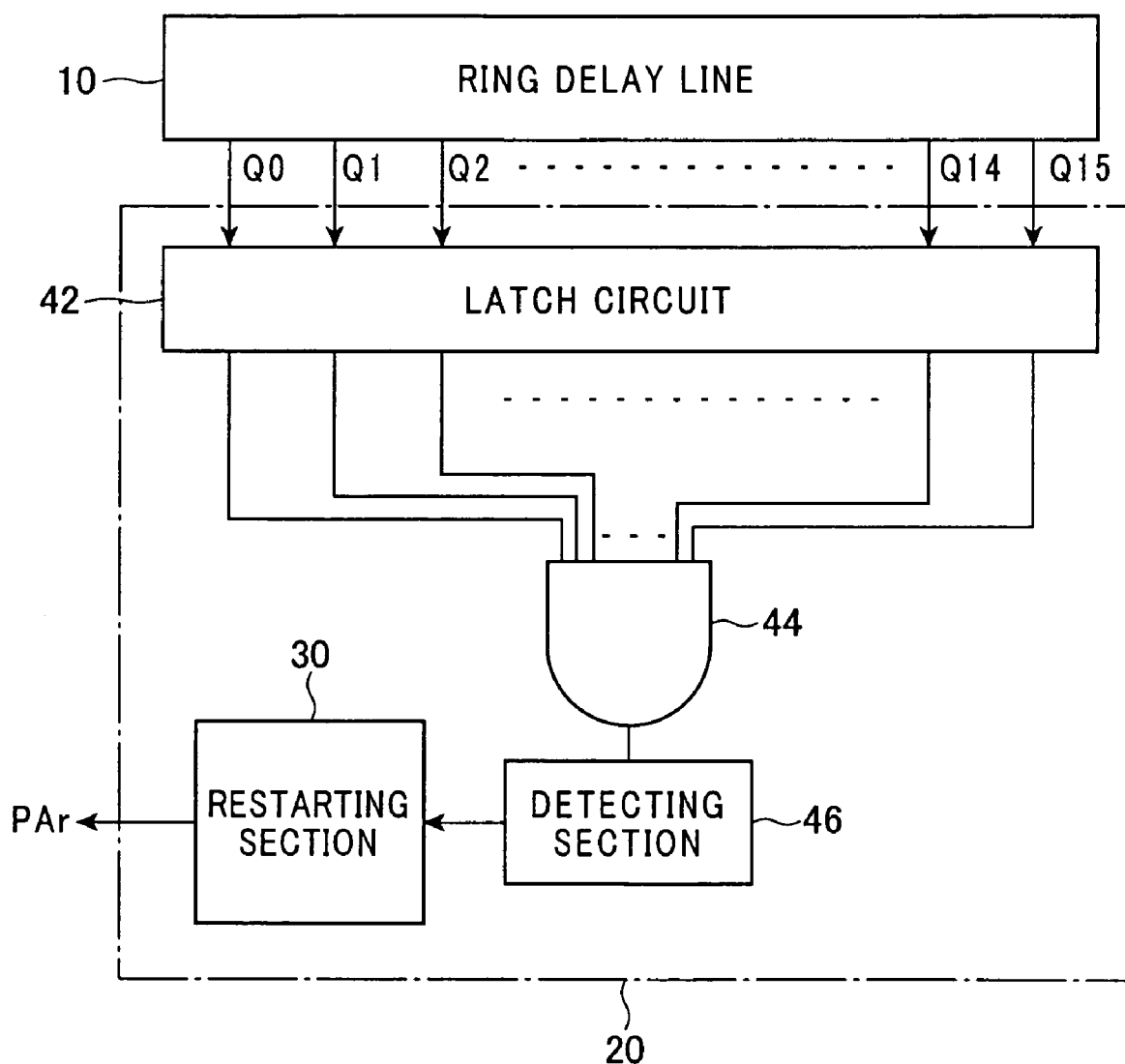
FIG. 5 is a block diagram showing the structure of a modification of the operation monitoring section.

In this case, the operation monitoring section 20 may be constituted as shown in FIG. 5.

The operation monitoring section 20 shown in FIG. 5 includes a latch circuit 42, an AND gate 44, a detecting section 46 and the restarting section 30. The latch circuit 42 periodically latches the outputs of the even stage inverter circuits by use of the external clock EXCK, for example. The AND gate 44 takes a logical sum of the outputs latched in the latch circuit 42. The detecting section 46 determines whether or not the output of the AND gate 44 is at the high level (1). The restarting section 30 restarts the ring delay line 10 when the detecting section 46 determines that the output of the AND gate 44 is at the high level (1), that is, when the detecting section 46 determines that the ring delay line 10 is not operating.

In the operation monitoring section 20 shown in FIG. 5, if the operation of the ring delay line 10 is stopped causing the outputs of all the even stage inverter circuits to be fixed to the high level (1), the detecting section 46 detects stoppage of the ring delay line 10 when the output of the AND gate 44 changes to the high level (1), and the restarting section 30 restarts the ring delay line 10 in response to this detection.

Also by configuring the operation monitoring section 20 as shown in FIG. 5, the same advantages as those obtained by the above embodiment can be obtained, because the stoppage of the ring delay line 10 can be detected promptly to restart the ring delay line promptly.

The above embodiment is configured such that the restarting section 30 restarts the ring delay line 10 when the operation monitoring section 20 detects stoppage of the ring delay line 10. However, the above embodiment may be modified so that when the operation monitoring section 20 detects stoppage of the ring delay line 10, it is informed to the user of the device.

In this case, the user can diagnose the cause of the stoppage, and take necessary measures to restart the ring delay line 10.

In the above embodiment, the number of the inverter circuits (the NAND gates and the inverters) constituting the ring delay line 10 is 32, the NAND gate NAND32 serves as the second starting inverter circuit is disposed at a prestage of the NAND gate NAND1 serving as the first starting inverter circuit, and the control terminal of the NAND gate NAND32 is applied with the output of the 18th inverter INV18 through the bypass path 10a. However, the number of the inverter circuits constituting the ring delay line 10, the location of the second starting inverter circuit, and the signal path through which the second control signal is applied to the second starting inverter circuit may be modified as necessary.

Figure 6:
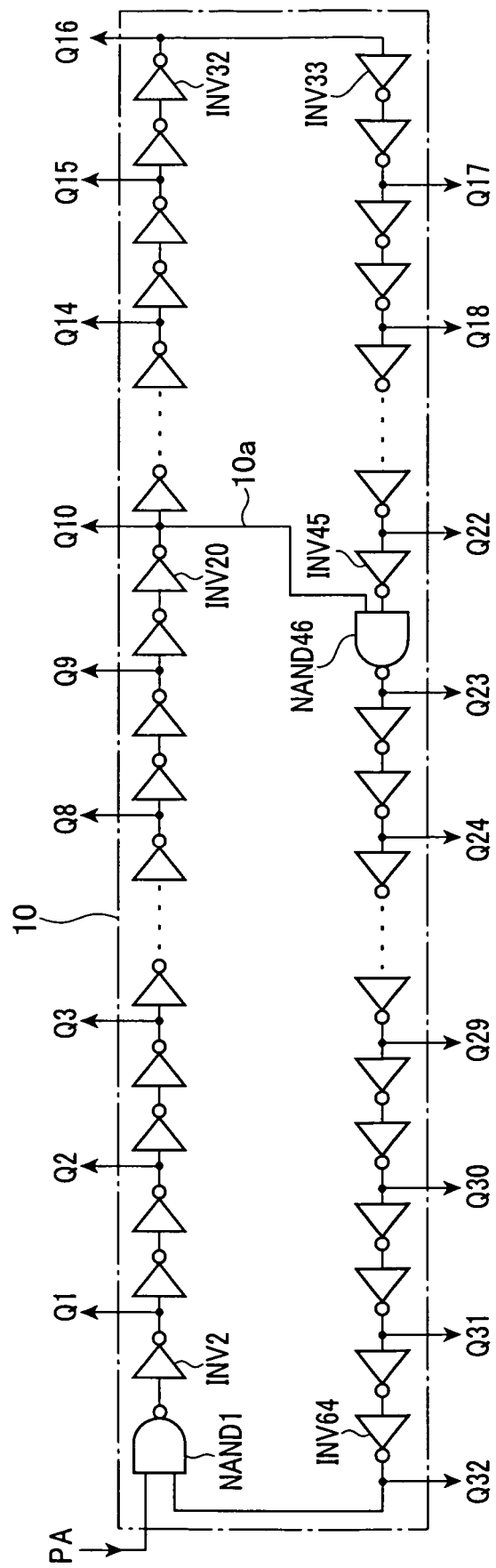
FIG. 6 is a diagram showing the structure of a modification of the ring delay line.

For example, the ring delay line 10 shown in FIG. 6 is constituted of 64 inverter circuits (NAND gates and inverters), the NAND gate NAND46 serving as the second starting inverter circuit being disposed at the 46th stage position from the NAND gate NAND1 serving as the first starting inverter circuit, the control terminal of the NAND gate NAND46 being applied with the output of the 20th stage inverter INV20 through the bypass path 10a. The same advantages as those provided by the above embodiment can be obtained also when the ring delay line 10 is modified as shown in FIG. 6.

Although the first and second starting inverter circuits are a NAND gate in the above embodiment, they may be a NOR gate. In this case, the ring delay line 10 is in the initialized state when the start pulse PA is at the high level (1), and is started when the start pulse PA changes to the low level (0).

The above explained preferred embodiments are exemplary of the invention of the present application which is described solely by the claims appended below. It should be understood that modifications of the preferred embodiments may be made as would occur to one of skill in the art.

What is claimed is:

1. An even-number-stage pulse delay device comprising:
a ring delay line constituted of an even number of inverter circuits connected in a ring, each of said inverter circuits being configured to perform an inverting operation to invert an input signal passing therethrough, a first one of said inverter circuits serving as a first starting inverter circuit which performs said inverting operation when applied with a first control signal, a second one of said inverter circuits excluding said first starting inverter circuit and excluding one of said inverter circuits immediately following said first one of said inverter circuits serving as a second starting inverter circuit which performs said inverting operation when applied with a second control signal;
a second-control-signal inputting section configured to cause an edge of a first pulse as a main edge and an edge of a second pulse as a reset edge which inverts in an opposite direction as said main edge to circulate together around said ring delay line, said first pulse being generated by applying said first control signal to said first starting inverter circuit to cause said first starting inverter circuit to perform said inverting operation, said second pulse being generated by applying said second control signal to said second starting inverter circuit during a time period after said main edge is generated at said first starting inverter circuit and before said main edge reaches said second starting inverter circuit from said first starting inverter circuit; and
an operation monitoring section configured to detect whether or not said main and reset edges are circulating around said ring delay line.

2. The even-number-stage pulse delay device according to claim 1, wherein said operation monitoring section takes in an output of one of said inverter circuits, and determines that circulation of said main and reset edges around said ring delay line is being stopped if said output does not change in level over a predetermined time period longer than a time needed for said main and reset edges to make one circulation around said ring delay line.

3. The even-number-stage pulse delay device according to claim 1, wherein said operation monitoring section takes in outputs of said inverter circuits at even number stages or outputs of said inverter circuits at odd number stages when a specific one of said inverter circuits is set as a first stage inverter circuit, and determines that circulation of said main and reset edges around said ring delay line is being stopped if said outputs taken in are fixed to the same level.

4. The even-number-stage pulse delay device according to claim 1, further comprising a restarting section configured to restart circulation of said main and reset edges around said ring delay line by generating a restart signal and applying said restart signal to said first starting inverter circuit as said first control signal when said operation monitoring section detects that circulation of said main and reset edges around said ring delay line is being stopped.

5. The even-number-stage pulse delay device according to claim 4, further comprising a selecting circuit which receives an initial start signal to initially start circulation of said main and reset edges around said ring delay line from outside said even-number-stage pulse delay device and said restart signal from said restarting section, and selectively applies one of said initial start signal and said restart signal as said start signal to said first starting inverter circuit.

6. The even-number-stage pulse delay device according to claim 1, wherein each of said inverter circuits is a logic gate circuit.

7. The even-number-stage pulse delay device according to claim 1, wherein said ring delay line and said operation monitoring section are formed by a CMOS process.

* * * * *